United States Patent [19]

Parrillo et al.

[11] Patent Number: 4,753,898
[45] Date of Patent: Jun. 28, 1988

[54] LDD CMOS PROCESS

[75] Inventors: Louis C. Parrillo; Stephen S. Poon, both of Austin, Tex.

[73] Assignee: Motorola, Inc., Schaumburg, Ill.

[21] Appl. No.: 71,002

[22] Filed: Jul. 9, 1987

[51] Int. Cl.$^4$ .................................. H01L 21/265
[52] U.S. Cl. ..................... 437/44; 437/34; 437/57; 357/233; 357/42
[58] Field of Search .......... 437/56, 57, 44, 34, 437/233, 238, 247; 357/23.3, 42; 156/643, 653, 657

[56] References Cited

U.S. PATENT DOCUMENTS

| | | | |
|---|---|---|---|
| 4,350,150 | 7/1982 | Shirato | 437/29 |
| 4,356,623 | 11/1982 | Hunter | 437/44 |
| 4,382,827 | 5/1983 | Romano-Moran et al. | 437/34 |
| 4,433,468 | 2/1984 | Kawamata | 437/34 |
| 4,488,351 | 12/1984 | Momose | 437/41 |
| 4,536,944 | 8/1985 | Bracco et al. | 437/30 |
| 4,590,663 | 5/1986 | Haken | 437/34 |
| 4,613,882 | 9/1986 | Pimbley et al. | 357/23.3 |
| 4,642,878 | 2/1987 | Maeda | 437/34 |

OTHER PUBLICATIONS

Ogura et al., "Latch-up Free, Double-Gated, Enhancement-Type P-Channel Device for CMOS with Enhanced Transconductance", IBM Technical Disclosure Bulletin, vol. 27, No. 1B, Jun. 1984, pp. 722-727.
E. Takeda, et al. "Submicrometer MOSFET Structure for Minimizing Hot-Carrier Generation", *IEEE Transactions on Electron Devices*, vol. ED-29, No. 4, Apr. 1982, pp. 611-618.
S. Ratham, et al. "An Optimized 0.5 Micron LDD Transistor", *International Electron Devices Meeting Papers*, vol. 10.2, 1983, pp. 237-241.
Y. Matsumoto, et al. "Optimized an Reliable LDD Structure for 1um NMOSFET Based on Substrate Current Analysis", *International Electron Devices Meeting Papers*, vol. 15.4, 1983, pp. 392-395.
Tsang, et al., "Fabrication of High-Performance LDDFET's with Oxide Sidewall-Spacer Technology", *IEEE Journal of Solid State Circuits*, vol. SC-17, No. 2, Apr. 1987.

*Primary Examiner*—Aaron Weisstuch
*Assistant Examiner*—M. Wilczewski
*Attorney, Agent, or Firm*—John A. Fisher; Jeffrey Van Myers

[57] ABSTRACT

A process is disclosed for fabricating LDD CMOS structures having a reduced mask count and improved manufacturability. In one embodiment of the invention a CMOS structure is formed having gate insulators overlying N and P type surface regions. Gate electrodes are formed on each of the surface regions and a spacer forming material is deposited over the electrodes and the surface regions. The spacer material is anisotropically etched from one of the surface regions to form spacers at the edge of the first gate electrode while retaining the spacer forming material over the second surface region. Source and drain regions of the first MOS transistor are implanted using the spacers as an implantation mask. The spacers are removed and a lightly doped source and drain is implanted using the gate electrode as a mask. The implanted source and drain regions are oxidized using the remaining spacer forming material as an oxidation mask to prevent oxidation of the second surface region. Devices are then fabricated in that second surface region by implanting devices of opposite conductivity type either with or without the formation of spacers and an LDD structure on the devices of second conductivity type.

14 Claims, 4 Drawing Sheets

LDD CMOS PROCESS

RELATED APPLICATION

This application discloses and claims a process which is an improvement to a process disclosed in copending, commonly assigned application Ser. No. 47,589 filed May 11, 1987, which is a continuation of Ser. No. 780,535 filed Sept. 26, 1985 and now abandoned

BACKGROUND OF THE INVENTION

This invention relates generally to a process for fabricating CMOS devices, and more specifically to a process for forming LDD CMOS devices with a reduced mask count and an improved manufacturability.

A problem called "hot carrier instability" has been well documented for MOS devices, and especially those MOS devices which have a narrow spacing between source and drain. The problem occurs as a result of high electrical fields, particularly near the drain, that cause energetic carriers ("hot carriers") to be injected into the gate or the substrate. The injection of hot carriers into the gate can cause oxide charging which manifests itself, over time, as a threshold voltage instability and a degraded device performance.

A number of solutions have been proposed for mitigating the problems of hot carrier injection. The most promising of these solutions is the use of a lightly doped drain (LDD) structure. This solution is discussed, for example, by Takeda, et al., "Submicrometer MOSFET Structure for Minimizing Hot-Carrier Generation", IEEE Transactions on Electron Devices, Vol. ED-29, No. 4, April 1982, pp. 611–618. The LDD structure consists of lightly doped source/drain regions adjacent the gate electrode with heavily doped source/drain regions laterally displaced from the gate electrode. The lightly doped region, which is driven just under the gate electrode, minimizes the injection of hot carriers and the heavily doped region provides a low resistance region which is easily contacted.

To be useful, the LDD structure used in a practical device must be fabricated by a process which is self-aligning. This requirement has led to the use of sidewall spacers which space the heavily doped source/drain regions a prescribed distance away from the gate electrode without relying on a critical photolithographic alignment step. The lightly doped regions are implanted using the gate electrode as an implantation mask. The sidewall spacer is formed by depositing a conformal layer of a spacer forming material overlying the gate electrodes. The spacer forming material is anisotropically etched to leave the material on all vertical surfaces including the edges of the gate electrodes. Spacers formed in this manner are then used as an ion implantation mask to space the heavy source/drain implant a lateral distance from the edge of the gate electrode with the lateral displacement determined by the thickness of the sidewall spacer material.

The use of the above described technology to form LDD CMOS circuit structures has generally led to the necessity for a large number of process steps. Additional process steps ultimately increase the cost of a device and should, if possible, be avoided. The above referenced application serial number 47,589 provides one process for making LDD CMOS devices with a reduced number of process steps. The process therein disclosed, however, relies on a differential oxidation of heavily doped regions versus lightly doped regions. The process is also inflexible in requiring certain annealing steps to be combined. Still further, the process requires additional deposition and sidewall formation steps.

Accordingly, a need existed for a improved process for forming LDD CMOS structures which would overcome the disadvantages of the prior art processes.

It is therefore an object of this invention to provide an improved process for forming LDD CMOS structures using a single LDD lithography mask.

It is another object of this invention to provide an improved LDD CMOS process to provide either single or double LDD structures.

It is yet another object of this invention to provide an improved process for forming LDD CMOS structures which allows flexibility in N-type and P-type thermal cycles.

It is a further object of this invention to provide an improved process for forming LDD CMOS structures in which differential oxidation of differently doped material is not critical to the process.

It is a still further object of the invention to provide an improved process for forming CMOS structures which reduces the number of processing steps.

BRIEF SUMMARY OF THE INVENTION

The foregoing and other objects and advantages of the invention are achieved through a LDD CMOS process which separates the formation of spacers on N-channel and P-channel devices. In accordance with one embodiment of the invention, a silicon substrate is provided having surface regions of N and P-type conductivity. An insulator is formed overlying the surface regions and gate electrodes are formed on the insulator. A spacer forming material is deposited over the gate electrodes and over the surface regions. In the single necessary masking step, the spacer forming material is anisotropically etched over one of the surface regions while the spacer forming material over the other region is protected by a patterned resist mask. Ions are implanted into the exposed portions of the source and drain regions using the spacer material as a mask, the spacers are removed, and additional ions are implanted into the source and drain regions to form the lightly doped portion of the structure. The ions are thermally redistributed by heating in an oxidizing ambient which grows a thermal oxide over the implanted source and drain regions. During the oxidation step, the spacer forming material, which was earlier protected and which remains in place, protects the unimplanted regions from being oxidized. The remaining spacer forming material can now be removed from the other surface region or patterned to form spacers to form non-LDD or LDD structures, respectively, as desired. During the formation of either type of source/drain structure in the second surface region, the thermally grown oxide protects the already formed source and drain regions from implantation of the opposite conductivity ions.

BRIEF DESCRIPTION OF THE DRAWINGS

FIGS. 1–5 and 8–10 illustrate, in cross-section, process steps in accordance with a further embodiment of the invention for fabricating double LDD CMOS structures.

DETAILED DESCRIPTION OF PREFERRED EMBODIMENTS

FIGS. 1-7 illustrate, in cross-section, process steps for fabricating LDD CMOS structures in accordance with one embodiment of the invention. The figures illustrate the fabrication of one N-channel transistor and one P-channel transistor. In the actual fabrication of a CMOS integrated circuit, of course, the process would provide for the simultaneous fabrication of a number of transistors of each device type as required by the circuit being implemented. The process illustrated is a "twin well" process, but the invention is equally applicable to an N-well or to a P-well process.

Figure 1:
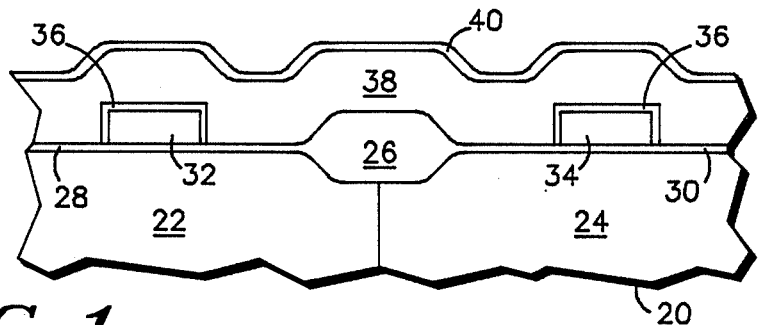
FIGS. 1–7 illustrate, in cross-section, process steps in accordance with one embodiment of the invention for fabricating single LDD CMOS structures.

FIG. 1 illustrates a portion of a silicon substrate 20 which includes a P-type surface region 22 and an N-type surface region 24. A thick field oxide 26 provides isolation between devices to be formed in N and P-type surface regions, respectively. Overlying P-type region 22 is a thin insulator 28 which is preferably silicon dioxide of about 25 nm thickness. In similar manner a thin insulator 30 of the same thickness is formed on the surface of N-type region 24. Gate electrodes 32,34, are formed overlying the respective insulators 28,30. Gate electrodes 32,34 are preferably polycrystalline silicon doped with a conductivity determining impurity to increase the conductivity thereof, but may also be other refractory materials, silicides, polycides and the like. A barrier layer 36 overlies the surfaces of the electrodes. If the gate electrodes are formed from polycrystalline silicon, barrier layer 36 is preferably silicon dioxide formed to a thickness of about 30 nm by the thermal oxidation of the polycrystalline silicon.

In accordance with a process for forming LDD structures, a spacer forming material 38 is conformally deposited over the surface of the structure. The spacer forming material overlies the gate electrodes, barrier layers 36, and each of the doped surface regions. The spacer forming material 38 is preferably undoped polycrystalline silicon, but other refractory materials such as oxides, nitrides, tungsten, or the like can also be used. The thickness of the spacer forming material determines the spacing of the heavily doped source/drain from the gate electrode, and can have a thickness, for example, of about 250 nm. When the spacer forming material is readily oxidizable as is polycrystalline silicon, it is preferred that an additional barrier layer 40 is formed over the top surface of the spacer forming material. The second barrier layer can be, for example, a layer of chemically vapor deposited silicon nitride with a thickness of about 20 nm. In this discussion, the term conformally means that the spacer forming material is deposited with substantially uniform thickness over the surface of the device structure.

Figure 2:
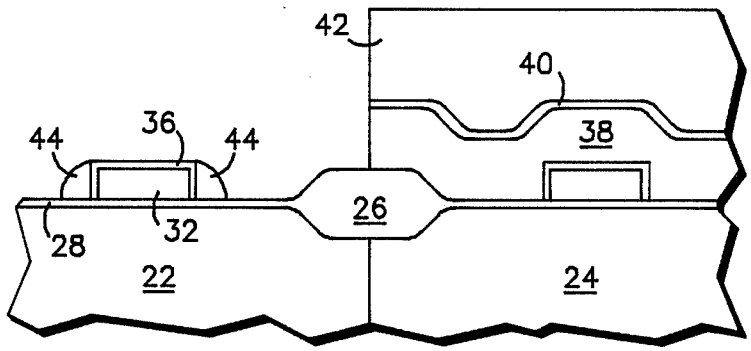

The process continues, in accordance with the invention, by the formation of a mask 42 such as a layer of patterned photoresist or other resist material overlying N-type surface region 24 as illustrated in FIG. 2. Mask 42 serves as an etch mask for the selective removal of barrier layer 40 and for the anisotropic etching of spacer forming material 38. Mask 42 generally covers the N-type surface region while spacers are formed for the fabrication of N-channel devices in the P-type surface region. The formation of mask 42 is the only lithography step required in the formation of sidewall spacers for the LDD structures in accordance with the invention. After removing the exposed portion of barrier layer 40 from over the P-type surface region 22, the exposed portion of the spacer forming material 38 is anisotropically etched, for example by reactive ion etching. The nature of the anisotropic etching of the conformal layer 38 results in the formation of spacers 44 at the edges of gate electrode 32. Insulator layer 28 protects the surface of surface region 22 and first barrier layer 36 protects the gate electrode 32 at the end of the anisotropic etch step. Layers 28,36 thus act as etch stops for the anisotropic etching.

Preferably, barrier layer 40 and spacer forming material 38 are sequentially etched in a single etching operation. For example, silicon nitride and polycrystalline silicon can be reactive ion etched in a chlorine based chemistry. If the etchants further include constituents for sidewall passivation such as HBr, the polycrystalline silicon is etched more than 50 times faster than the silicon dioxide layers 28 and 36.

Figure 3:
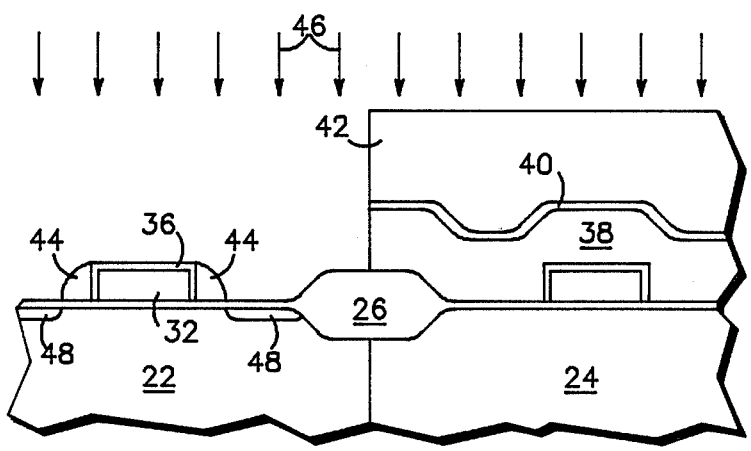

After formation of the sidewall spacers, the structure is ion implanted with an N-type dopant such as arsenic at an energy of 80 keV to a dose of $7 \times 10^{15}$ cm$^{-2}$ to form the heavily doped portion of the source and drain regions of N-channel MOS transistors. The implantation is illustrated by arrows 46 and is masked by gate electrode 32, spacers 44, and field oxide 26. Mask 42 is also preferably left on the structure to act as an ion implantation mask, but the masking can be done by barrier 40 and sidewall spacer material 38. The implantation places a quantity of N-type doping material into the surface of P-type region 22 to form a portion 48 of the source and drain regions as illustrated in FIG. 3. Portion 48 is spaced from the gate electrode structure by the width of sidewall spacers 44 (and also by the thickness of barrier material 36).

Figure 4:
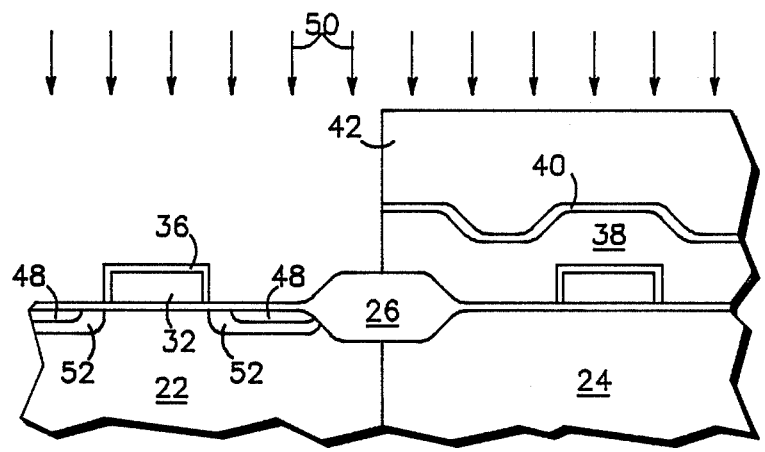

After the removal of the sidewall spacer, the lightly doped portions of the source and drain regions are implanted using the gate electrode 32 as an implantation mask as illustrated in FIG. 4. The spacers can be removed, for example, by an isotropic dry etch such as SF6. The implantation of an N-type conductivity determining impurity such as phosphorus or arsenic is illustrated by arrows 50 and causes the introduction of the dopant material into area 52 of the source and drain regions. The implantation of the lightly doped portions can be, for example, ions of phosphorus at 40 keV to a dose of $5 \times 10^{13}$ cm$^{-2}$. The implantation is of course also masked by mask 42 and field oxide 26. The implantation also overlaps the more heavily doped region 48.

Mask 42 is removed and the structure is heated in an oxidizing ambient to redistribute ("drive-in") the ion implanted material and to grow a thicker oxide 54 over the surface of the P-type surface region 22. Preferably the redistribution and oxidation are done in a two step heat treatment. The structure is first heated to about 900° C. for 30 minutes in an inert ambient and then is oxidized for about 20 minutes at about 830° C. in dilute steam to grow about 90 nm of thermal oxide on the N+silicon. After the redistribution, the source and drain regions 56 have the characteristics illustrated in FIG. 5. The source and drain regions have a lightly doped portion 58 which is aligned with and diffused slightly under the edge of gate electrode 32 and a more heavily doped region 60 which is spaced from the edge of the gate electrode. Whether the heavily doped or lightly doped region is deeper is determined primarily by the diffusion rate of the dopant species used for the two regions. If phosphorus is used for the lightly doped region and arsenic for the heavily doped region, the lightly doped phosphorus region is likely to be deeper.

During the oxidation step which causes the redistribution of implanted impurities and which causes the growth of oxide 54, barrier layer 40 prevents the oxidation of the upper surface of the remainder of spacer forming material 38. The exposed edge of that material is, however, oxidized to form oxide region 62.

Undoped polycrystalline silicon 38 oxidizes more slowly than either N+doped single crystal silicon or N+doped polycrystalline silicon. Oxide region 62 can thus be removed in dilute HF (e.g. 100:1) without adversely affecting oxide 36 or 54. If spacer forming material 38 is removed before etching oxide region 62, region 62 will be etched from both sides and will be removed even more quickly. Further, the formation of region 62 can be prevented by heat treating the structure, including the exposed edge of polycrystalline silicon 38, in $N_2$ (for example, in a rapid thermal anneal process) before growing thermal oxide 54. The $N_2$ treatment will grow a thin layer of silicon nitride on the edge of the polycrystalline silicon which will prevent oxidation.

In an alternate embodiment, barrier layer 40 can be eliminated from the process, thus allowing the top surface of material 38 to also oxidize during the growth of oxide 54. In that embodiment the presence of mask 42 during the implantation steps prevents the doping of material 38. During the growth of oxide 54, the surface of the source and drain regions, being heavily doped with the implanted ions, oxidizes more rapidly than does the top surface of the undoped spacer forming material 38. An oxide thickness differential thus exists between the oxide grown over the source and drain regions and the oxide grown over the spacer forming material.

Figure 6:
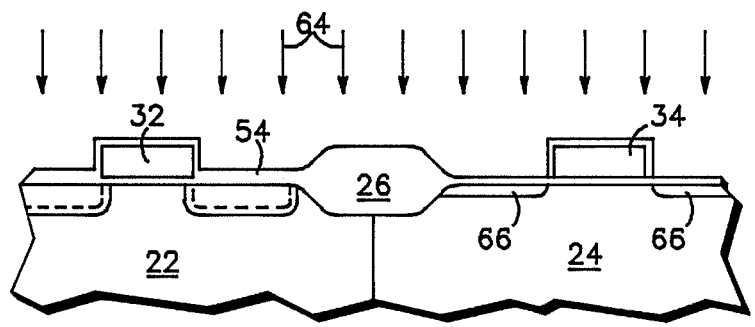

In accordance with one embodiment of the invention, barrier layer 40 is removed by etching selectively in an etchant which removes the barrier layer substantially faster than oxide 54. If the barrier layer is silicon nitride, for example, the nitride is etched by a dip in dilute HF (e.g., 100:1) followed by about 30 seconds in hot (160° C.) phosphoric acid. Oxide 54 is etched very little during the etching of the nitride. The spacer forming material 38 is then removed, again with a preferential etchant which does not substantially affect oxide 54. Polycrystalline silicon, for example, is plasma etched in a chlorine chemistry containing $Cl_2$ and HBr followed by a short isotropic clean up etch in $SF_6$ which etches oxide 54 relatively slowly. The structure is then implanted with a P-type conductivity determining impurity to dope the source and drain regions of the P-channel transistors which are to be formed. As illustrated in FIG. 6, the implantation, as illustrated by arrows 64, places the P-type dopant into selected regions 66 of N-doped surface region 24 in self-alignment with gate electrode 34. The ion implantation 64 is masked by the field oxide 26 and gate electrodes 32 and 34 as well as by the oxide 54 grown over the N-type source and drain regions. The implantation can be done with BF2 ions at an energy of 65 keV and a dose of $5 \times 10^{15}$ cm$^{-2}$.

Figure 7:
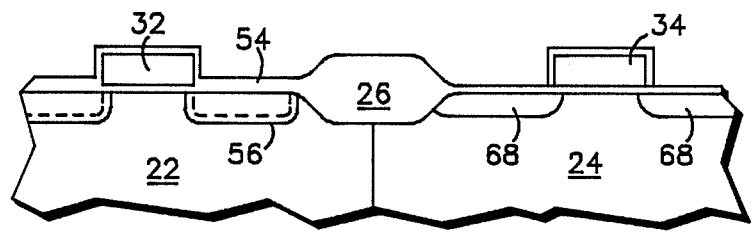

The source and drain structure of the P-channel devices is then completed by a thermal redistribution of the P-type implanted dopant material to form source and drain regions 68 as illustrated in FIG. 7. The redistribution can be done, for example, at 900° C. for 15 minutes. This redistribution step is independent of the redistribution of the source and drain regions of the N-channel devices except that it is, of course, cumulative in effect to the thermal redistribution already performed on those regions. In this embodiment of the invention the LDD structure is formed only on the N-channel devices and the P-channel devices have a conventional, non-LDD structure. The processing of such a structure then continues in a conventional manner to produce the necessary insulators, contact metallization, and the like.

Figure 5:
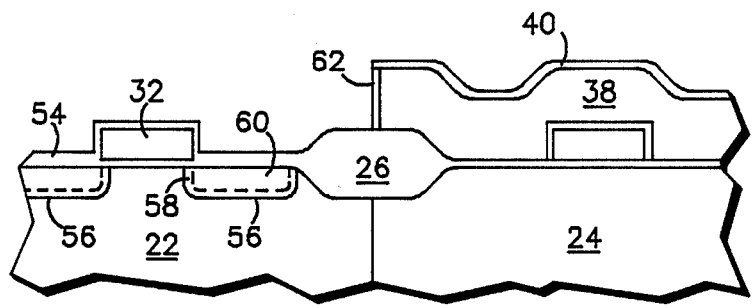
Figure 8:
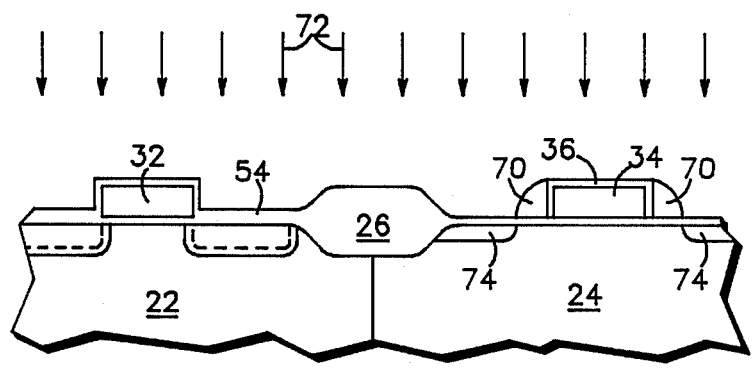
Figure 9:
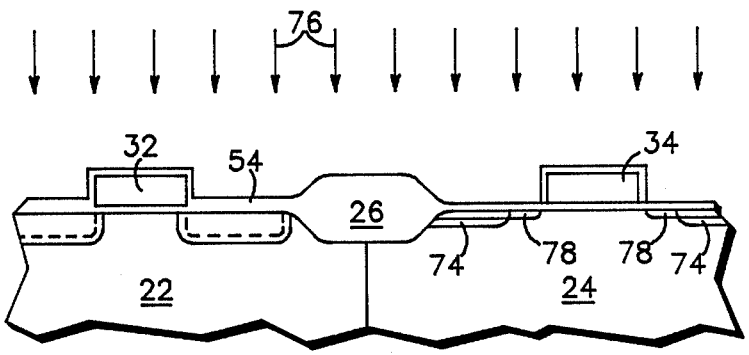
Figure 10:
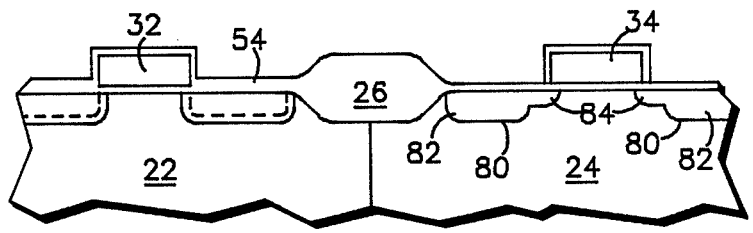

An alternate embodiment of the invention is illustrated in FIGS. 8–10 which illustrate a continuation of a process after the structure derived in FIG. 5 has been achieved. This embodiment of the invention thus includes the steps shown in FIGS. 1–5 together with the steps shown in FIGS. 8–10.

After the structure illustrated in FIG. 5 is obtained, the process continues by removing barrier layer 40 and anisotropically etching sidewall forming material 38 to form sidewalls 70 illustrated in FIG. 8. This process for forming sidewalls is the same as that described above for forming sidewalls 44 in FIG. 2. After forming sidewall spacers 70, the structure is implanted with a P-type conductivity determining dopant as illustrated by the arrows 72 to form doped regions 74. For example, BF2 ions are implanted at an energy of 65 keV to a dose of $5 \times 10^{14}$ cm$^{-2}$. These doped regions are heavily doped and are spaced laterally away from gate electrode 34 by the thickness of sidewall spacer 70 (and the thickness of barrier layer 36).

Sidewall spacers 70 are removed and the structure is again implanted with P-type conductivity determining impurities as illustrated by arrows 76. The second implantation of P-type conductivity determining ions forms a doped region 78 which is more lightly doped than region 74 and which is self-aligned with gate electrode 34. The second P-type implant can be, for example, $BF_2$ ions at an energy of 65 keV to a dose of $1 \times 10^{14}$ cm$^{-2}$.

The structure is then thermally annealed to redistribute the two P-type ion implantations to form source and drain regions 80 having a deep and heavily doped region 82 which is spaced away from gate electrode 34 and a more lightly doped portion 84 which is aligned with and slightly overlapped by the gate electrode 34. Again, as with the structure illustrated above, the processing of the structure illustrated in FIG. 10 continues in conventional manner to provide necessary and conventional insulating layers, contact metallization, and the like. The structure illustrated in FIG. 10 is provided with a double LDD structure; that is, the LDD structure is found on both the N-channel and P-channel MOS transistors.

Thus it is apparent that there has been provided, in accordance with the invention, an improved process for forming a CMOS structure which fully meets the objects and advantages set forth above. Although the invention has been described and illustrated with reference to specific embodiments thereof, it is not intended that the invention be limited to these illustrative embodiments. For example, the order of processing N-channel and P-channel transistors could be inverted. Likewise, an LDD structure could be formed only on the P-channel transistors. In other variations, different insulators, different ions and ion anneals, different etchants and etch processes can be employed without departing from the spirit of the invention. Accordingly, it is intended to encompass within the invention all such variations and modifications as fall within the scope of the appended claims.

We claim:

1. A process for fabricating a CMOS device comprising the sequential steps of:
   providing a silicon substrate including surface regions of first and second conductivity type;
   forming an insulator overlying said surface regions;
   forming first and second gate electrodes insulatively spaced from said surface regions of first and second conductivity type, respectively
   depositing a spacer forming material over said first and second electrodes and said surface regions;
   anisotropically etching said spacer forming material over said surface region of first conductivity type to form spacers at the edges of said first gate electrode while retaining said spacer forming material unetched over said surface region of second conductivity type;
   implanting conductivity type determining ions of second conductivity type into said surface region of first conductivity type using said spacers as ion implantation masks to thereby form heavily doped regions of second conductivity type in said surface region of first conductivity type;
   removing said spacers and implanting conductivity determining ions of second conductivity type into said surface region of first conductivity type to thereby form lightly doped regions of second conductivity type at least partially coincident with said heavily doped regions of second conductivity type formed in the previous implantation step;
   removing said unetched spacer forming material over said surface region of second conductivity type;
   and performing a blanket implantation of conductivity determining ions of first conductivity type.

2. The process of claim 1 wherein said spacer forming material comprises polycrystalline silicon.

3. The process of claim 2 further comprising after said step of depositing a spacer forming material comprising polycrystalline silicon, the step of depositing a barrier material overlying said polycrystalline silicon.

4. The process of claim 1 further comprising, after said stpe of depositing a spacer forming material, the step of depositing a first barrier layer overlying said spacer forming material.

5. The process of claim 4 wherein said step of depositing a first barrier layer comprises depositing a layer of silicon nitride.

6. The process of claim 1 further comprising, after said steps of forming a first gate electrode and a second gate electrode, the step of forming a second barrier layer overlying each of said first and second gate electrodes.

7. The process of claim 6 wherein said second barrier layer comprises silicon oxide.

8. The process of claim 1 wherein said insulator comprises silicon oxide.

9. The process of claim 1 wherein said step of removing said spacer forming material comprises anisotropically etching to form second spacers at the edge of said second gate electrode.

10. The process of claim 9 wherein said step of implanting conductivity determining ions of first conductivity type further comprises the steps of implanting first conductivity determining ions of first conductivity type using said second spacers as an ion implantation mask;
    removing said second spacers;
    and implanting second conductivity determining ions of first conductivity type.

11. A process for the fabrication of CMOS devices comprising the sequential steps of:
    providing first and second gate electrodes on a silicon substrate for first and second complementary MOS transistors;
    forming a first oxide layer and a second spacer material layer overlying said gate electrodes;
    selectively masking to protect said second layer overlying said second gate electrode;
    etching exposed portions of said second layer to form first sidewall spacers at edges of said first gate electrode and leaving unetched portions of said second layer overlying said second gate electrode;
    implanting first conductivity determining impurities of first conductivity type using said first sidewall spacers as an ion implantation mask to thereby form heavily doped regions of first conductivity type in said silicon substrate;
    removing said first sidewall spacers and implanting conductivity determining impurities of first conductivity type using said first gate electrode as an ion implantation mask; to thereby form lightly doped regions of first conductivity type at least partially coincident with said heavily doped regions of first conductivity type formed in the previous implantation step
    thermally oxidizing using remaining unetched portions of said second layer as an oxidation mask;
    etching said remaining unetched portions of said second layer;
    and performing a blanket implantation of conductivity determining impurities of second conductivity type using said second gate electrode as an ion implantation mask.

12. The process of claim 11 wherein said step of etching said unetched remaining portions comprises etching to form second sidewall spacers at edges of said second gate electrode.

13. The process of claim 12 further comprising the steps of implanting second conductivity type using said second sidewall spacers as an ion implantation mask;
    and then removing said sidewall spacers.

14. A process for fabricating a CMOS device comprising the sequential steps of:
    providing a silicon substrate including first and second surface regions of first and second conductivity type, respectively, and having an oxide layer on the surface thereof and first and second gate electrodes thereover;
    forming a first barrier layer overlying said first and second gate electrodes;
    depositiong a layer of polycrystalline silicon overlying said first barrier layer and exposed poritons of said oxide layer over said first and second regions;
    forming a second barrier layer overlying said layer of polycrystalline silicon;
    forming a mask layer overlying said second region;
    removing exposed portions of said second barrier layer and anisotoropically etching said layer of polycrystalline silicon to leave polycrystalline silicon spacers at the edges of said first gate electrode and unetched portions of said polycrystalline silicon overlying said second region;
    implanting ions of second conductivity determining type into said first surface region using said spacers as an ion implantation mask to thereby form heavily doped regions of second conductivity type in said surface region of first conductivity type;

removing said spacers and implanting ions of second conductivity determining type into said first surface region to thereby form lightly doped regions of second conductivity type at least partially coincident with said heavily doped regions of second conductivity type formed in the previous implantation step;

heating in an oxidizing ambient to grow a thermal oxide on said first surface region, said second surface region protected from oxidation by said unetched portions;

removing said second barrier layer and said unetched portions of said layer of polycrystalline silicon over said second region;

and performer a blanket implantation of ions of first conductivity determining type.

* * * * *